United States Patent
Asada et al.

[11] Patent Number: 5,999,719
[45] Date of Patent: Dec. 7, 1999

[54] ION IMPLANTATION PROCESS SIMULATION DEVICE REALIZING ACCURATE INTERPOLATION OF ION IMPLANTATION PROFILES AND SIMULATION METHOD THEREFOR

[75] Inventors: Susumu Asada; Koichi Sawahata, both of Tokyo, Japan

[73] Assignee: NEC Corporation, Tokyo, Japan

[21] Appl. No.: 09/030,774

[22] Filed: Feb. 26, 1998

[30] Foreign Application Priority Data

Feb. 27, 1997 [JP] Japan .................................. 9-044030

[51] Int. Cl.$^6$ .................................................. G06F 3/00
[52] U.S. Cl. ................. 395/500.33; 395/500.23; 364/178; 708/290
[58] Field of Search .................. 395/500.33, 500.23; 708/290; 364/178

[56] References Cited

U.S. PATENT DOCUMENTS

| | | | |
|---|---|---|---|
| 5,719,796 | 2/1998 | Chen | 364/578 |
| 5,845,105 | 12/1998 | Kunikiyo | 395/500 |
| 5,859,784 | 1/1999 | Sawahata et al. | 364/578 |
| 5,889,687 | 3/1999 | Enda | 364/578 |

OTHER PUBLICATIONS

Al F. Tasch et al., "An Improved Approach to Accurately Model Shallow B and $BF_2$ Implants in Silicon", *J. Electrochem. Soc.*, vol. 136, No. 3, Mar. 1989, pp. 810–814.

*Primary Examiner*—Kevin J. Teska
*Assistant Examiner*—Thai Pham
*Attorney, Agent, or Firm*—Sughrue, Mion, Zinn, Macpeak & Seas, PLLC

[57] ABSTRACT

An ion implantation process simulation device includes a Dual Pearson data extracting unit for generating a Dual Pearson data table from ion implantation profile data, a Dual Pearson data for interpolation obtaining unit for obtaining a parameter for use in the interpolation and extrapolation of a dose coefficient from the Dual Pearson data table, a dose coefficient interpolating/extrapolating unit for expressing an ion implantation profile by linear connection of two functions respectively representing an amorphous component and a channeling component, as well as using a dose-independent moment parameter and a coefficient of linear connection dependent on dose to interpolate and extrapolate a logarithmic value of a channeling component dose coefficient with respect to logarithmic values of all dose values, and a simulation result outputting unit for outputting a simulation result.

16 Claims, 8 Drawing Sheets

(PRIOR ATR)

(PRIOR ATR)

ION IMPLANTATION PROCESS SIMULATION DEVICE REALIZING ACCURATE INTERPOLATION OF ION IMPLANTATION PROFILES AND SIMULATION METHOD THEREFOR

BACKGROUND OF THE INVENTION

1. Field of the Invention

The present invention relates to an ion implantation process simulation device realizing accurate interpolation and extrapolation of ion implantation profiles including tails in ion implantation process simulation for a semiconductor device, and a simulation method therefor.

2. Description of the Related Art

A manufacturing process of semiconductor devices including LSI includes a step of implanting impurity ions as dopant into a semiconductor substrate by an ion implantation technique and diffusing and activating them through a thermal treatment. It is well-known that an impurity distribution obtained in this step accounts for the considerable change in a threshold voltage Vt, an ON-state current of a transistor and other electrical characteristics parameters. In recent years, in particular, for reducing a semiconductor in size to achieve high density large capacity and high speed, designing a transistor with shallower junctions has been gaining more importance. More specifically, demanded is not only accurate control of a peak concentration of impurities but also accurate adjustment of position of the tail of an ion implantation profile.

In order to meet this demand, ion implantation process simulation using a computer is adopted. This is a method of predicting and calculating various ion implantation profiles for use in manufacturing semiconductor devices by using predetermined models and algorithms on a computer. Use of ion implantation process simulation largely contributes to the reduction in the number of experimental steps for improving element characteristics of a semiconductor device and to the improvement in efficiency of designing work.

In simulating ion implantation profiles, in general, ion implantation profiles are described using a Gaussian or Pearson function which can obtain satisfactory enough approximation when crystals are amorphous. At that time, since ion implantation into a semiconductor crystal substrate reflects crystallinity of the substrate, profiles will vary depending on crystal orientation of the substrate and an ion implantation angle, that is, the channeling phenomenon will occur. The channeling phenomenon tends to decrease with an increase in dose value. This is because crystals become amorphous as a dose value is increased. Profiles of ion implantation into a semiconductor crystal substrate can not therefore be described by using a simple Gaussian or Pearson function but can be described by using a plurality of functions.

A technique of describing a profile of ion implantation into a semiconductor crystal substrate by using a function and simulating the same is disclosed, for example, in "An Improved Approach to Accurately Model Shallow B and $BF_2$ Implants in Silicon" (Al F. Tasch, H. Shin, and C. Park; J. Electrochem. Soc., Vol. 136, No. 3, March 1989, pp. 810–814; The Electrochemical Society, Inc.). The literature recites a method of more accurately simulating experimental profiles of as-implanted ion impurities. The experimental profiles are results of measurement obtained by the SIMS (Secondary Ion Mass Spectrometry) method. SIMS is a well-known method of irradiating a surface region of a semiconductor with a primary ion such as an oxygen ion or a cesium ion to generate a secondary ion and conducting mass analysis of the secondary ion to measure an impurity distribution. The experimentally obtained ion implantation profile is expressed using two Pearson functions which represent an amorphous component and a channeling component, respectively. The ion implantation profile $N(x)$ is described as a sum of the two components as shown in the following equation (1).

$$N(x) = D_{main} f_{main}(x) + D_{sub} f_{sub}(x) \tag{1}$$

where a main peak amorphous component function $f_{main}(x)$ and a subsidiary peak channeling component function $f_{sub}(x)$ are normalized functions not dependent on a dose value, while $D_{main}$ represents a main peak amorphous component dose coefficient and $D_{sub}$ represents a subsidiary peak channeling component dose coefficient. A total dose $D_T$ of the ion implantation profile $N(x)$ is described as a sum of coefficients of the amorphous component dose and the channeling component dose as shown in the following equation (2).

$$D_T \equiv \int_0^\infty N(x) dx = D_{main} + D_{sub} \tag{2}$$

The Pearson function used here is described using four kinds of moment parameters, projected range Rp, standard deviation $\Delta Rp$, skewness $\gamma$ and kurtosis $\beta$.

In the following, description will be made of a conventional ion implantation process simulation method of obtaining an ion implantation profile for a prescribed dose by interpolation, with reference to a flow chart of FIG. 6. With reference to FIG. 6, first, from table data of ion implantation profiles for several dose values, extract moment parameters, projected range Rp, standard deviation $\Delta Rp$, skewness $\gamma$ and kurtosis $\beta$ in two normalized functions respectively representing the amorphous component and the channeling component (moment parameters of a Dual Pearson function), an amorphous component dose coefficient and a channeling component dose coefficient (Step 601). As a result, a Dual Pearson data table is prepared. Next, select parameters for doses at two points most neighboring to an arbitrary dose from the Dual Pearson data table (Step 602). Next, out of the selected parameters, linearly interpolate the dose-dependent amorphous component dose coefficient and channeling component dose efficient with respect to dose (Step 603).

More specifically, first, use SIMS experimental profile data at a plurality of dose points to extract a functional parameter value and a ratio of the coefficients of an amorphous component dose at a main peak to a total dose, $D_{main}/D_T$. The functional parameter and the ratio of the coefficients of an amorphous component dose at a main peak to a total dose are recited for boron and $BF_2$ in the above-described literature.

FIG. 7 is a diagram showing a dose dependency as a parameter to be interpolated. In FIG. 7, the abscissa represents a dose value, the ordinate represents a main peak amorphous component dose ratio and the polygonal line represents a dose dependency of a main peak amorphous component dose ratio. As illustrated in FIG. 7, the number of dose points of the experimental data shown in the diagram are five, not so many. Ratios of the coefficients of a main peak amorphous component dose to the total dose at the other doses need to be interpolated for all the doses. When moment data and ratios of coefficients of a main peak amorphous component dose to the total dose ($D_{main, i}/D_{T, i}$)

and ($D_{main, i+1}/D_{T, i+1}$) of the ion implantation profile at dose values $D_{T, i}$ and $D_{T, i+1}$ of two points for the interpolation or extrapolation with respect to an arbitrary dose value $D_{T, a}$ are given, linear interpolation by a conventional simulation method will result in describing a ratio of each coefficient of the amorphous component dose and the channel component dose to the total dose at the arbitrary dose value $D_{T, a}$, that is, ($D_{main, a}/D_{T, a}$) and ($D_{sub, a}/D_{T, a}$), as shown in the following equation (3).

$$(D_{main,a}/D_{T,a}) = \frac{(D_{T,i+1} - D_{T,a})(D_{main,i}/D_{T,i}) + (D_{T,a} - D_{T,i})(D_{main,i+1}/D_{T,i+1})}{(D_{T,i+1} - D_{T,i})} \quad (3)$$

$$(D_{sub,a}/D_{T,a}) = 1 - (D_{main,a}/D_{T,a})$$

According to the above-described conventional ion implantation process simulation method, however, when profiles $N_i$ (x) and $N_{i+1}$ (x) at two dose points $D_{T, i}$ and $D_{T, i+1}$ ($D_{T, i} < D_{T, i+1}$) satisfy the relationship $N_i$ (x)<$N_{i+1}$(x), inversion might occur between the intensity of a profile $N_a$ (x) obtained by linear interpolation with respect to a dose point $D_{T, a}$ located between the two points and the intensity of the profile $N_{i+1}$ (x). Shown in FIG. 8 as an example are calculation results obtained by a standard process simulator SUPREM-3 which is widely used at present. With reference to FIG. 8, the curve CP3 of the profile $N_a$ (x) obtained by linear interpolation between the profile curves CP2 and CP4 according to the above-described conventional linear interpolation method crosses with the profile curves CP1 and CP2 for larger doses at the tail. In other words, the profile curve CP3 is undesirably shown to have a higher concentration than those of the profile curves CP1 and CP2.

Based on this result, it is possible to conduct interpolation with respect to a logarithmic value of a dose on the abscissa according to the following equation (4).

$$(D_{main,a}/D_{T,a}) = \frac{(\log D_{T,i+1} - \log D_{T,a})(D_{main,i}/D_{T,i}) + (\log D_{T,a} - \log D_{T,i})(D_{main,i+1}/D_{T,i+1})}{(\log D_{T,i+1} - \log D_{T,i})} \quad (4)$$

$$(D_{sub,a}/D_{T,a}) = 1 - (D_{main,a}/D_{T,a})$$

While the interpolation results obtained in this case are slightly improved as compared with those of FIG. 8, undesirable inversion of the intensity at the tail can not be avoided.

As described in the foregoing, conventional ion implantation process simulation methods have a drawback that in simulation of an impurity profile for junction depth, undesirable interpolation is caused at a tail of the ion implantation profile to prevent acquisition of accurate simulation results.

SUMMARY OF THE INVENTION

An object of the present invention is to provide an ion implantation process simulation device which accurately interpolates and extrapolates ion implantation profiles for a semiconductor device covering tails and a simulation method therefor.

According to the first aspect of the invention, an ion implantation process simulation device which conducts ion implantation process simulation for a semiconductor device to conduct interpolation and extrapolation necessary for an ion implantation profile, comprises data extracting means for extracting, from ion implantation profile data, moment parameters, projected range, standard deviation, skewness and kurtosis, in two normalized functions respectively representing an amorphous component and a channeling component, an amorphous component dose coefficient and a channeling component dose coefficient to generate a data table, interpolation data obtaining means for obtaining a parameter for use in the interpolation and extrapolation of a dose coefficient from said data table generated by said data extracting means, dose coefficient interpolating/extrapolating means for using, out of parameters obtained by said interpolation data obtaining means, two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions, as well as using, at the time of describing said ion implantation profile for a dose value designated by a user, dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values, and simulation result outputting means for outputting a simulation result obtained by the interpolation and extrapolation of a dose coefficient by said dose coefficient interpolating/extrapolating means.

In the preferred construction, said dose coefficient interpolating/extrapolating means, when moment data, and an amorphous component dose coefficient and a channeling component dose coefficient $D_{main, i}$, $D_{sub, i}$ and $D_{sub, i+1}$ of the ion implantation profile at dose values $D_{T, i}$ and $D_{T, i+1}$ of two points for conducting interpolation and extrapolation with respect to an arbitrary dose value $D_{T, a}$ are given, calculates an amorphous component dose coefficient and a channeling component dose coefficient $D_{main, a}$ and $D_{sub, a}$ at the arbitrary dose value $D_{T, a}$ according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}$$

In the preferred construction, said dose coefficient interpolating/extrapolating means, when an experimentally extracted moment parameter is dependent on a dose value, further interpolates and extrapolates said dose-dependent moment parameter with respect to logarithmic values of all doses.

In the preferred construction, said dose coefficient interpolating/extrapolating means, when moment data, and an amorphous component dose coefficient and a channeling component dose coefficient $D_{main, i}$, $D_{sub, i}$ and $D_{sub, i+1}$ of the ion implantation profile at dose values $D_{T, i}$ and $D_{T, i+1}$ of two points for conducting interpolation and extrapolation with respect to an arbitrary dose value $D_{T, a}$ are given, calculates an amorphous component dose coefficient and a channeling component dose coefficient $D_{main, a}$ and $D_{sub, a}$ at the arbitrary dose value $D_{T,a}$ according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}$$

when an experimentally extracted moment parameter is dependent on a dose value, further defines dose-dependent moment parameters at dose values $D_{T,i}$ and $D_{T,i+1}$ of two points for conducting interpolation and extrapolation with respect to an arbitrary dose value $D_{T,a}$ as $\mu_{m,i}$ and $\mu_{m,i+1}$, respectively, and calculates a moment parameter $\mu_{m,a}$ at the arbitrary dose value $D_{T,a}$ according to the following equation:

$$\mu_{m,a} = \frac{(\log D_{T,i+1} - \log D_{T,a})\mu_{m,i} + (\log D_{T,a} - \log D_{T,i})\mu_{m,i+1}}{(\log D_{T,i+1} - \log D_{T,i})}$$

According to the second aspect of the invention, an ion implantation process simulation method of conducting ion implantation process simulation for a semiconductor device to conduct interpolation and extrapolation necessary for an ion implantation profile, comprising the steps of:

extracting, from ion implantation profile data, moment parameters, projected range, standard deviation, skewness and kurtosis, in two normalized functions respectively representing an amorphous component and a channeling component, an amorphous component dose coefficient and a channeling component dose coefficient to generate a data table, obtaining a parameter for use in the interpolation and extrapolation of a dose coefficient from said data table generated at said data extracting step, and out of parameters obtained at said interpolation data obtaining step, using two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions, as well as using, at the time of describing said ion implantation profile for a dose value designated by a user, dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values.

In the preferred construction, at said dose coefficient interpolating/extrapolating step, when moment data, and an amorphous component dose coefficient and a channeling component dose coefficient $D_{main,i}$, $D_{sub,i}$ and $D_{sub,i+1}$ of the ion implantation profile at dose values $D_{T,i}$ and $D_{T,i+1}$ of two points for conducting interpolation and extrapolation with respect to an arbitrary dose value $D_{T,a}$ are given, an amorphous component dose coefficient and a channeling component dose coefficient $D_{main,a}$ and $D_{sub,a}$ at the arbitrary dose value $D_{T,a}$ are calculated according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}$$

In the preferred construction, said dose coefficient interpolating/extrapolating step further comprises the step of, when an experimentally extracted moment parameter is dependent on a dose value, interpolating and extrapolating said dose-dependent moment parameter with respect to logarithmic values of all doses.

In another preferred construction, at said dose coefficient interpolating/extrapolating step, when moment data, and an amorphous component dose coefficient and a channeling component dose coefficient $D_{main,i}$, $D_{sub,i}$ and $D_{sub,i+1}$ of the ion implantation profile at dose values $D_{T,i}$ and $D_{T,i+1}$ of two points for conducting interpolation and extrapolation with respect to an arbitrary dose value $D_{T,a}$ are given, an amorphous component dose coefficient and a channeling component dose coefficient $D_{main,a}$ and $D_{sub,a}$ at the arbitrary dose value $D_{T,a}$ are calculated according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}$$

when an experimentally extracted moment parameter is dependent on a dose value, dose-dependent moment parameters at dose values $D_{T,i}$ and $D_{T,i+1}$ of two points for conducting interpolation and extrapolation with respect to an arbitrary dose value $D_{T,a}$ are defined as $\mu_{m,i}$ and $\mu_{m,i+1}$, respectively, and a moment parameter $\mu_{m,a}$ at the arbitrary dose value $D_{T,a}$ is calculated according to the following equation:

$$\mu_{m,a} = \frac{(\log D_{T,i+1} - \log D_{T,a})\mu_{m,i} + (\log D_{T,a} - \log D_{T,i})\mu_{m,i+1}}{(\log D_{T,i+1} - \log D_{T,i})}$$

According to the third aspect of the invention, an ion implantation process simulation method of conducting ion implantation process simulation for a semiconductor device to conduct interpolation and extrapolation necessary for an ion implantation profile, comprising the steps of:

using two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions, and using dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values.

In the preferred construction, at said step of interpolating and extrapolating a logarithmic value of said channeling component dose coefficient with respect to logarithmic values of all dose values, with respect to an arbitrary dose value as a target of interpolation and extrapolation, a channeling component dose coefficient for the arbitrary dose value is interpolated and extrapolated by using said amorphous component dose coefficients and channeling component dose coefficients at dose values of two points most neighboring to the dose value.

According to another aspect of the invention, an ion implantation process simulation method of conducting ion implantation process simulation for a semiconductor device to conduct interpolation and extrapolation necessary for an ion implantation profile, comprising the steps of:

using two normalized functions respectively representing an amorphous component and a channeling component, and an amorphous component dose coefficient and a channeling component dose coefficient corresponding to the two functions to express a profile of ion implantation into a semiconductor crystal substrate as linear connection of said two functions, and using moment parameters extracted from the ion implantation profile and linear connection coefficients at a plurality of dose values to, when an experimentally extracted moment parameter is dependent on a dose value, interpolate and extrapolate said dose-dependent moment parameter with respect to logarithmic values of all dose values.

In the preferred construction, at said step of interpolating and extrapolating a logarithmic value of said channeling component dose coefficient with respect to logarithmic values of all dose values, with respect to an arbitrary dose value as a target of interpolation and extrapolation, dose-dependent said moment parameters at dose values of two points most neighboring to the dose value are used to interpolate and extrapolate a moment parameter for the dose value.

According to a still further aspect of the invention, a computer readable memory having a control program for controlling an ion implantation process simulation device to conduct ion implantation process simulation for a semiconductor device and conduct interpolation and extrapolation necessary for an ion implantation profile, said control program comprising the steps of:

from ion implantation profile data, extracting moment parameters, projected range, standard deviation, skewness and kurtosis, in two normalized functions respectively representing an amorphous component and a channeling component, an amorphous component dose coefficient and a channeling component dose coefficient to generate a data table, obtaining a parameter for use in the interpolation and extrapolation of a dose coefficient from said data table generated at said data extracting step, and out of parameters obtained at said interpolation data obtaining step, using two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions, as well as using, at the time of describing said ion implantation profile for a dose value designated by a user, dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
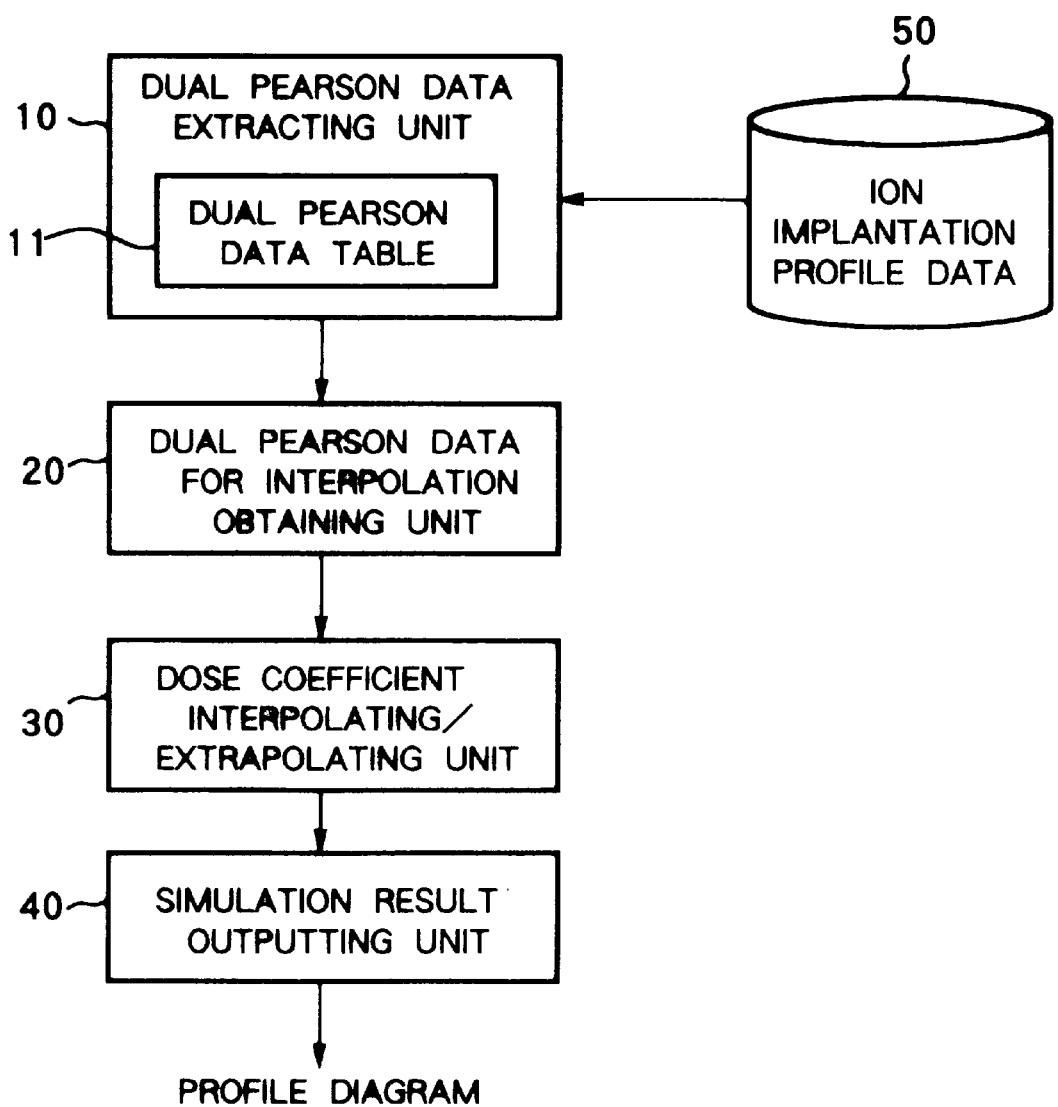
FIG. 1 is a block diagram showing structure of an ion implantation simulation device according to one embodiment of the present invention.

FIG. 1 is a block diagram showing structure of an ion implantation process simulation device according to one embodiment of the present invention. The ion implantation process simulation device of the present embodiment is implemented by a computer system such as a work station or a personal computer, and functions of the present embodiment which will be described in the following are executed by a control program which controls the computer system. The control program is provided as storage in a storage medium such as a magnetic disk or a semiconductor memory and load of the control program into a processing device of the computer system realizes the ion implantation process simulation device of the present embodiment.

With reference to FIG. 1, the ion implantation process simulation device of the present invention includes a Dual Pearson data extracting unit 10 for extracting desired Dual Pearson data from ion implantation profile data 50 to generate a Dual Pearson data table 11, a Dual Pearson data for interpolation obtaining unit 20 for obtaining Dual Pearson parameters for use in interpolating and extrapolating dose coefficients from the Dual Pearson data table 11 generated by the Dual Pearson data extracting unit 10, a dose coefficient interpolating/extrapolating unit 30 for interpolating or extrapolating dose coefficients by using a parameter obtained by the Dual Pearson data for interpolation obtaining unit 20, and a simulation result outputting unit 40 for outputting a simulation result obtained by interpolation of dose coefficients. In FIG. 1, illustration is made only of a characteristic part of the structure of the present embodiment and that of the remaining common part is omitted.

Prior to the execution of simulation, the Dual Pearson data extracting unit 10 receives input of the ion implantation profile data 50 for various dose values to generate the Dual Pearson data table 11 in advance. Stored in the Dual Pearson data table 11 are moment parameters, projected range Rp, standard deviation ΔRp, skewness γ and kurtosis β in two normalized functions respectively representing an amorphous component and a channeling component (moment parameters of a Dual Pearson function), an amorphous component dose coefficient and a channeling component dose coefficient.

The Dual Pearson data for interpolation obtaining unit 20 obtains parameters at dose values of two points most neighboring to an arbitrary dose designated by a designation means not shown (hereinafter referred to as a Dual Pearson parameter) from the Dual Pearson data table 11.

The dose coefficient interpolating/extrapolating unit 30, when out of the Dual Pearson parameters obtained by the Dual Pearson data for interpolation obtaining unit 20, an amorphous component dose coefficient and a channeling component dose coefficient are dependent on a dose value, interpolates or extrapolates the amorphous component dose coefficient and the channeling component dose coefficient with respect to all the dose values in the following manner.

More specifically, the dose coefficient interpolating/extrapolating unit 30 first uses two normalized functions respectively representing the amorphous component and the channeling component, and an amorphous component dose coefficient and a channeling component dose coefficient corresponding to the two functions to express a profile of ion implantation into a semiconductor crystal substrate as linear connection of the two functions. Then, at the time of describing an ion implantation profile for a dose value designated by a user, the unit 30 uses dose-independent moment parameters extracted from the ion implantation profile and coefficients of the linear connection dependent on dose at a plurality of dose values to interpolate or extrapolate a logarithmic value of a channeling component dose coefficient with respect to logarithmic values of all the dose values.

The foregoing operation will be expressed by an equation. When moment data, and an amorphous component dose coefficient and a channeling component dose coefficient $D_{main, i}$, $D_{sub, i}$ and $D_{sub, i+1}$ of the ion implantation profile at dose values $D_{T, i}$ and $D_{T, i+1}$ of two points for the interpolation or extrapolation with respect to an arbitrary dose value $D_{T, a}$ are given, an amorphous component dose coefficient and a channeling component dose coefficient $D_{main, a}$ and $D_{sub, a}$ at the arbitrary dose value $D_{T, a}$ is calculated according to the following equation (5).

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})} \quad (5)$$

$$D_{main,a} = D_{T,a} - D_{sub,a}$$

Figure 3:
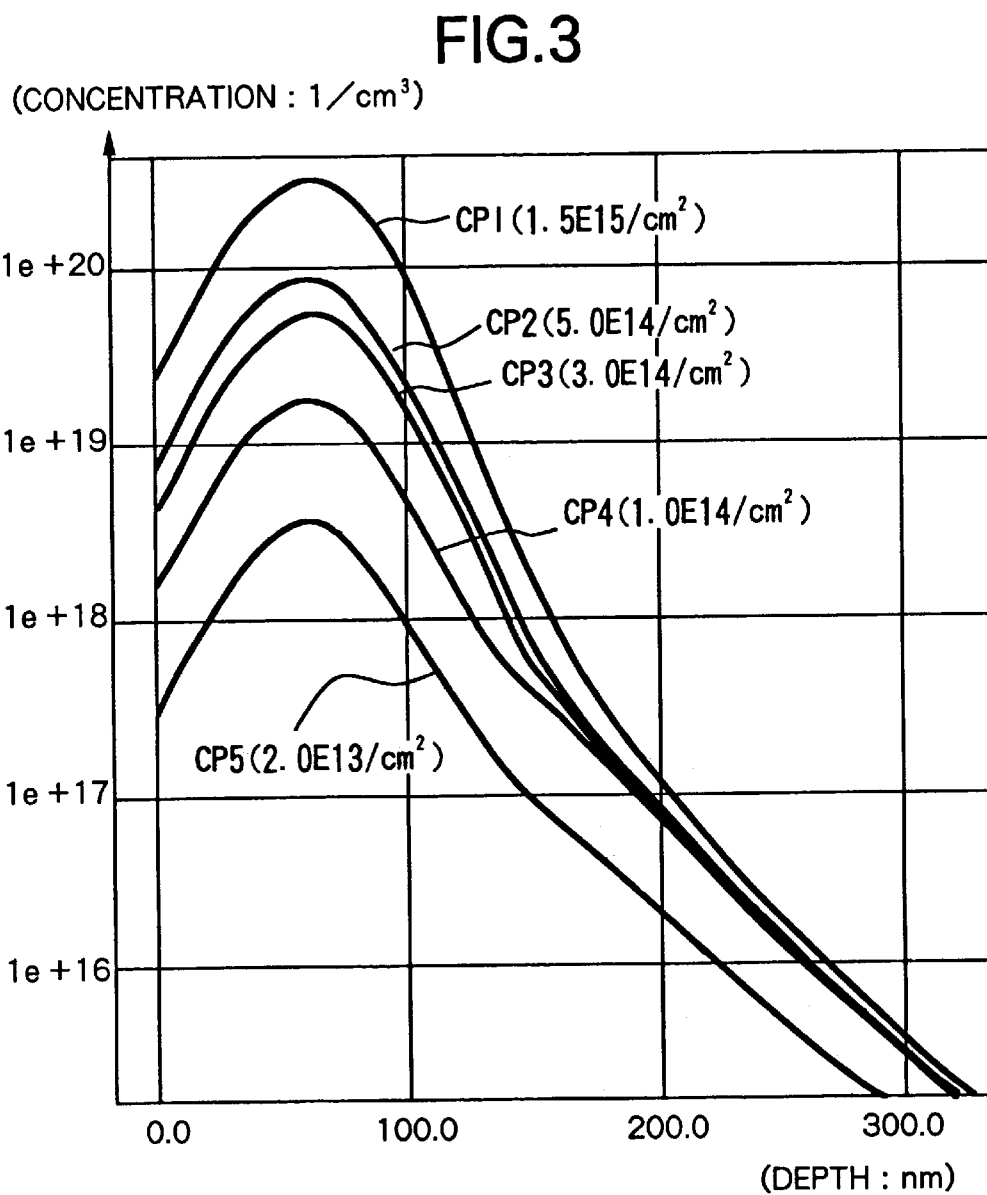
FIG. 3 is a diagram of profiles showing the state of interpolation of ion implantation profiles according to the present embodiment.

The simulation result outputting unit 40 generates such a profile diagram as shown in FIG. 3 by using a simulation result obtained by the interpolation and extrapolation by the dose coefficient interpolating/extrapolating unit 30 and displays the same on a display device or prints out the same.

Figure 2:
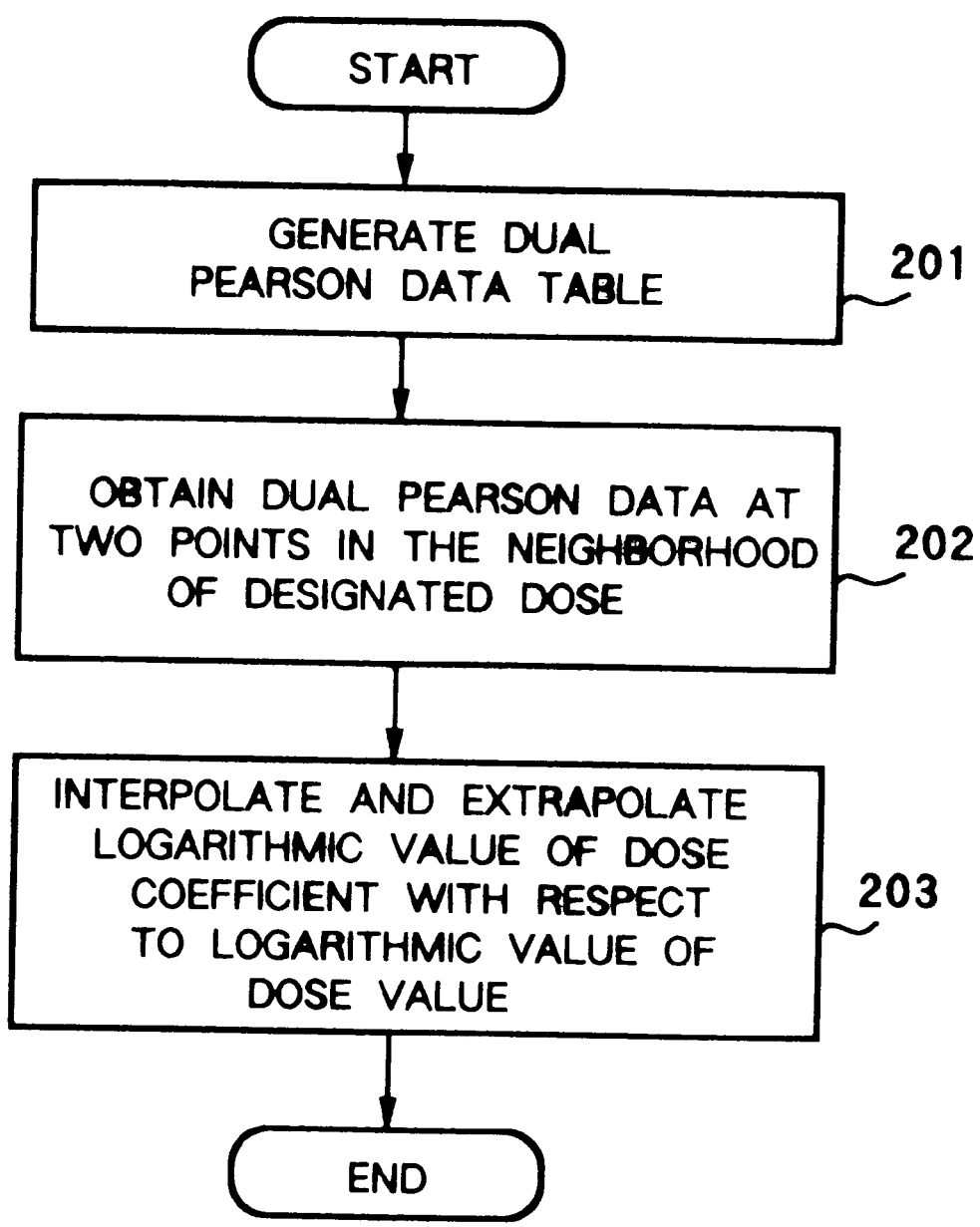
FIG. 2 is a flow chart showing operation of the ion implantation simulation device according to the present embodiment.

Description will be next made of operation of the present embodiment with reference to the flow chart shown in FIG. 2. The Dual Pearson data extracting unit 10 first extracts moment parameters, an amorphous component dose coefficient and a channeling component dose coefficient of a Dual Pearson function from the ion implantation profile data 50 for several dose values to generate the Dual Pearson data table 11 (Step 201).

Next, the Dual Pearson data for interpolation obtaining unit 20 obtains Dual Pearson parameters for dose values at two points most neighboring to an arbitrary dose designated by a designation means not shown from the Dual Pearson data table 11 (Step 202).

Next, the dose coefficient interpolating/extrapolating unit 30 determines whether out of the Dual Pearson parameters obtained by the Dual Pearson data for interpolation obtaining unit 20, an amorphous component dose coefficient and a channeling component dose coefficient are dependent on a dose value or not and when the determination is made that they are dose dependent, interpolates or extrapolates the amorphous component dose coefficient and the channeling component dose coefficient with respect to the dose value in question in the above-described manner (Step 203).

Based on the calculation results of ion implantation profiles thus obtained by interpolation and extrapolation of dose coefficients, the simulation result outputting unit 40 generates and outputs a profile diagram. FIG. 3 shows calculation results of ion implantation profiles for $BF_2$ according to the present embodiment.

With reference to FIG. 3, accurate profiles are obtained in which a curve CP3 of a profile $N_a$ (x) obtained by the interpolation with respect to a dose $D_{T, a}$ between two kinds of doses of profile curves CP2 and CP4 crosses with neither of the profile curves CP1 and CP2 with larger doses at any part of the entire curve including the tail.

Figure 4:
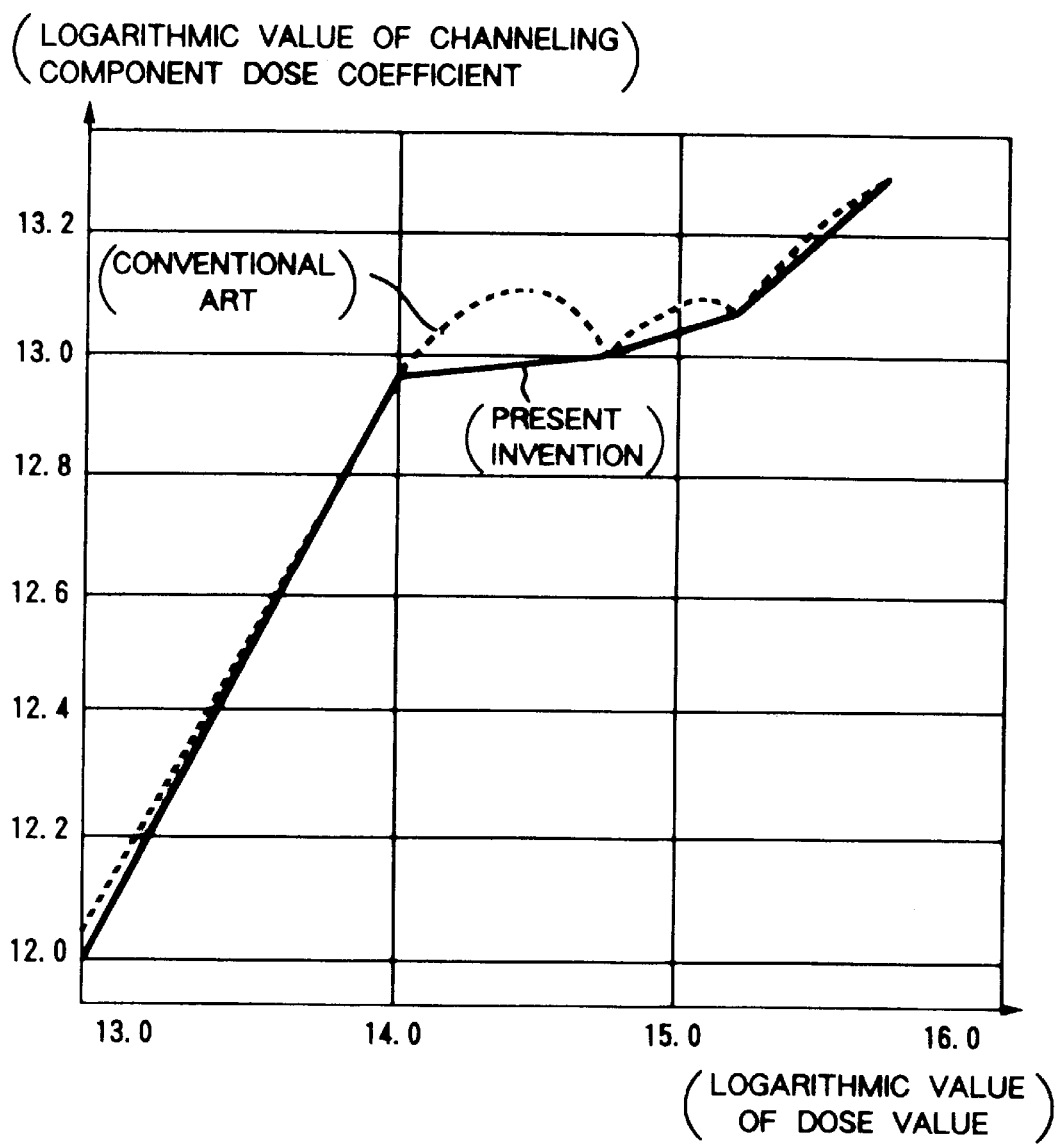
FIG. 4 is a diagram showing a channeling component dose coefficient according to the present embodiment as compared with a conventional interpolation result.

FIG. 4 is a diagram showing a channeling component dose coefficient as compared with that of conventional simulation. In FIG. 4, the solid line denotes a relationship between a logarithmic value of a channeling component dose coefficient and a logarithmic value of all dose values in the simulation according to the present embodiment, while the broken line denotes a relationship between a logarithmic value of a channeling component dose coefficient and a logarithmic value of all dose values in conventional simulation. With reference to FIG. 4, a rugged part appears in the conventional simulation as indicated by the broken line, while in the simulation according to the present embodiment, the relationship shows monotonic increase as indicated by the solid line.

As described in the foregoing, the present embodiment enables accurate interpolation of ion implantation profiles including tails which is demanded in simulation for a junction depth crucial to the manufacture of semiconductor devices.

Description will be next made of an ion implantation process simulation device according to another embodiment of the present invention. Structure of the present embodiment is the same as that of the first embodiment shown in FIG. 1 and therefore no illustration is made thereof.

In the present embodiment, the dose coefficient interpolating/extrapolating unit 30, similarly to the first embodiment, interpolates or extrapolates an amorphous component dose coefficient and a channeling component dose coefficient with respect to a dose value, and also determines whether out of Dual Pearson parameters, moment parameters of a Dual Pearson function for dose values at two points most neighboring to a dose value to be calculated are dose dependent and when the determination is made that they are dose dependent, interpolates or extrapolates the moment parameters of the Dual Pearson function with respect to a dose in a manner set forth in the following.

More specifically, when the extracted moment parameters are dose dependent, the unit 30 interpolates or extrapolates the above-described dose-dependent moment parameters with respect to a logarithmic value of all doses.

This operation will be expressed by an equation. Dose-dependent moment parameters of a Dual Pearson function at dose values $D_{T,i}$ and $D_{T,i+1}$ of two points for the interpolation or extrapolation with respect to an arbitrary dose value $D_{T,a}$ are defined as $\mu_{m,i}$ and $\mu_{m,i+1}$, respectively. A moment parameter $\mu_{m,a}$ of the Dual Pearson function at the arbitrary dose value $D_{T,a}$ will be accordingly expressed by the following equation (6).

$$\mu_{m,a} = \frac{(\log D_{T,i+1} - \log D_{T,a})\mu_{m,i} + (\log D_{T,a} - \log D_{T,i})\mu_{m,i+1}}{(\log D_{T,i+1} - \log D_{T,i})} \quad (6)$$

Figure 5:
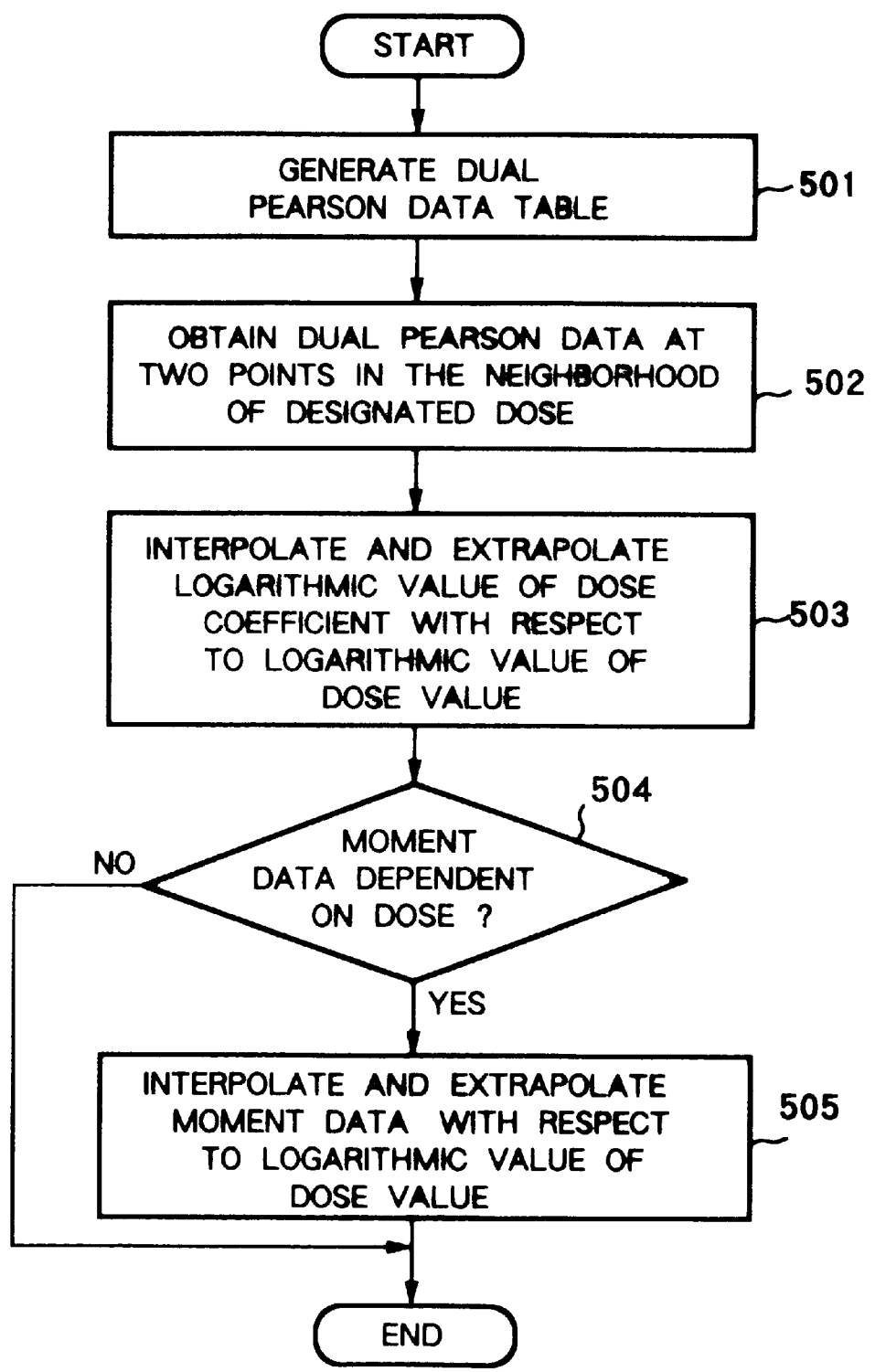
FIG. 5 is a flow chart showing another operation of the ion implantation simulation device according to the present embodiment.
Figure 6:
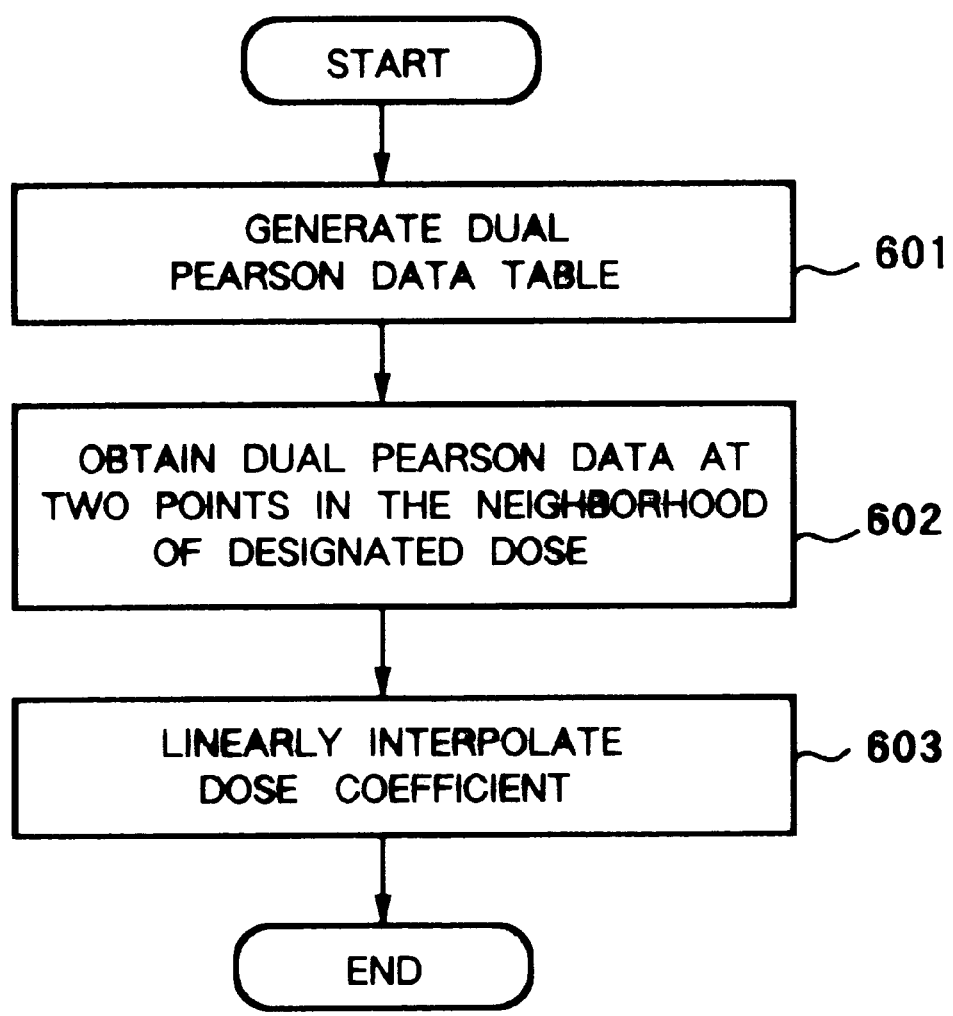
FIG. 6 is a flow chart showing a procedure of conventional ion implantation simulation.
Figure 7:
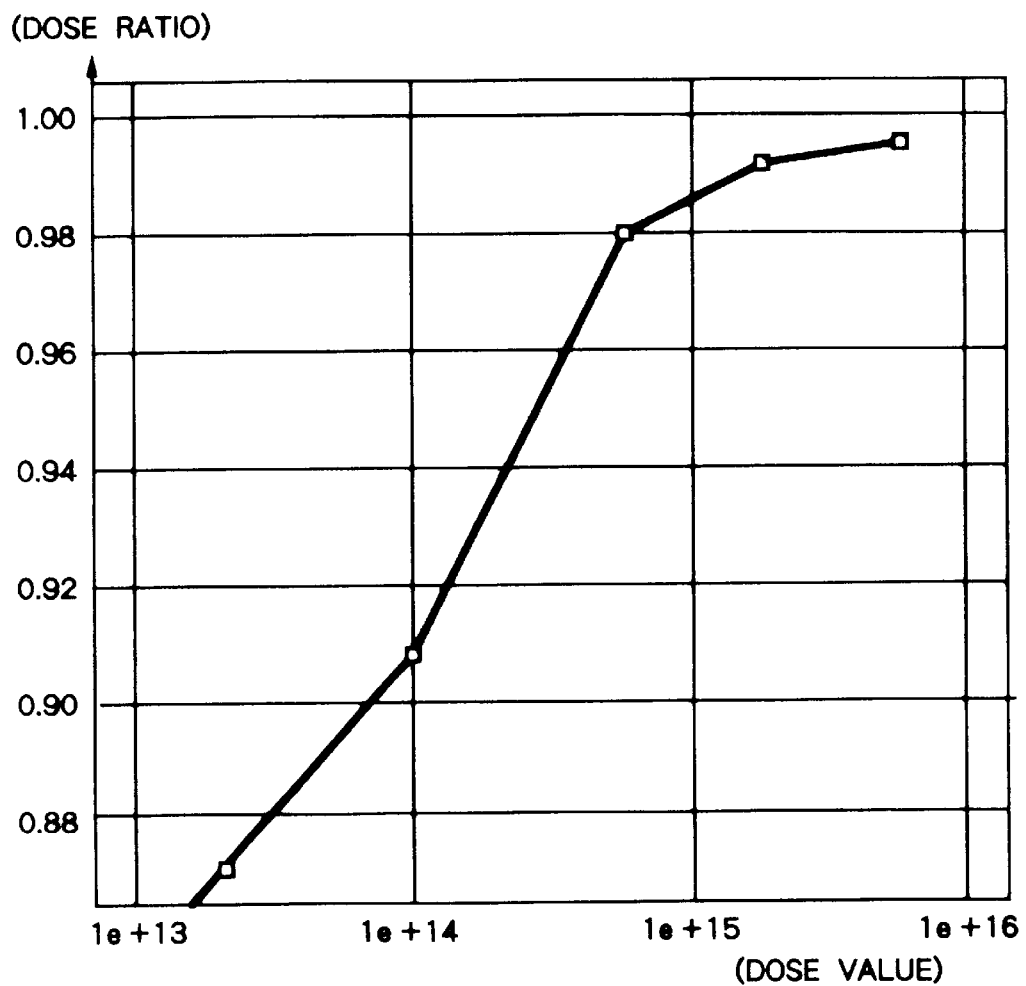
FIG. 7 is a diagram showing dose dependencies of parameters to be interpolated in a conventional ion implantation process simulation method.
Figure 8:
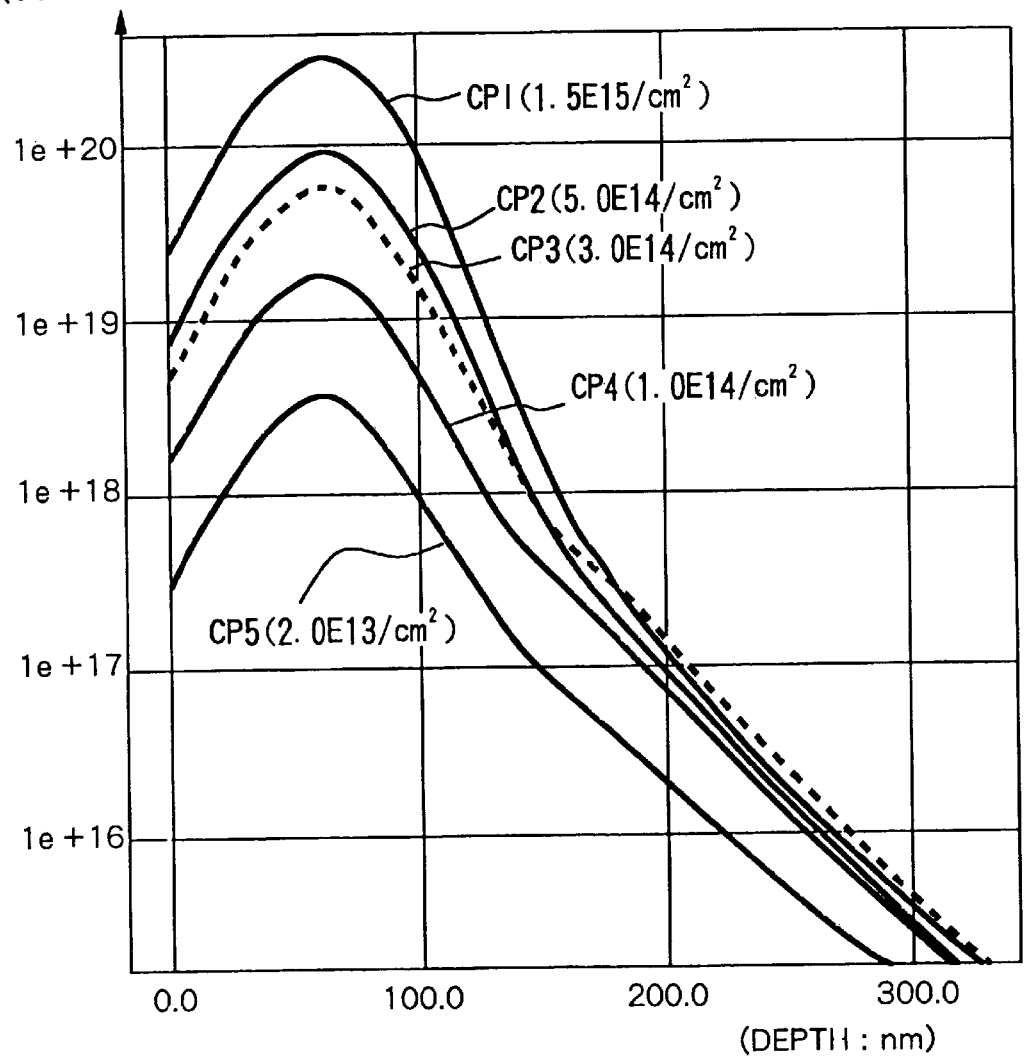
FIG. 8 is a diagram of profiles showing the state of interpolation of ion implantation profiles according to the conventional ion implantation process simulation method.

FIG. 5 is a flow chart showing another example of operation of the present embodiment. With reference to FIG. 5, operation at Steps 501 to 503 by the dose coefficient interpolating/extrapolating unit 30 is the same as that at Steps 201 to 203 of the operation example shown in FIG. 3. Thereafter, the dose coefficient interpolating/extrapolating unit 30 determines whether out of the Dual Pearson parameters, moment parameters of a Dual Pearson function for dose values at two points most neighboring to a dose value to be calculated are dose dependent and when they are dependent, interpolates or extrapolates the moment parameters of the Dual Pearson function with respect to a dose in the following manner (Steps 504 and 505).

When arsenic ions are experimentally implanted into a semiconductor crystal substrate, for example, obtained as skewness γ is a dose-dependent parameter. In this case, according to a conventional dose interpolation method using linear interpolation, profile curves might cross with each other at tails in some cases, while the present invention enables accurate profiles to be obtained in which none of profile curves crosses with each other at tails.

As described in the foregoing, by interpolating and extrapolating a logarithmic value of a channeling component dose coefficient and a dose-dependent moment parameter with respect to a logarithmic value of all doses, the present invention enables accurate interpolation and extrapolation of ion implantation profiles including tails.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An ion implantation process simulation device which conducts ion implantation process simulation for a semiconductor device to conduct interpolation and extrapolation necessary for an ion implantation profile, comprising:

data extracting means for extracting, from ion implantation profile data, moment parameters, projected range, standard deviation, skewness and kurtosis, in two normalized functions respectively representing an amorphous component and a channeling component, an amorphous component dose coefficient and a channeling component dose coefficient to generate a data table;

interpolation data obtaining means for obtaining a parameter for use in the interpolation and extrapolation of a dose coefficient from said data table generated by said data extracting means;

dose coefficient interpolating/extrapolating means for using, out of parameters obtained by said interpolation data obtaining means, two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions, as well as using, at the time of describing said ion implantation profile for a dose value designated by a user, dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values; and simulation result outputting means for outputting a simulation result obtained by the interpolation and extrapolation of a dose coefficient by said dose coefficient interpolating/extrapolating means.

2. The ion implantation process simulation device as set forth in claim 1, wherein said dose coefficient interpolating/extrapolating means, when moment data, and an amorphous component dose coefficient and a channeling component dose coefficient $D_{main,i}$, $D_{sub,i}$ and $D_{sub,i+1}$ of the ion implantation profile at dose values $D_{T,i}$ and $D_{T,i+1}$ of two points for conducting interpolation and extrapolation with respect to an arbitrary dose value $D_{T,a}$ are given, calculates an amorphous component dose coefficient and a channeling component dose coefficient $D_{main,a}$ and $D_{sub,a}$ at the arbitrary dose value $D_{T,a}$ according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}.$$

3. The ion implantation process simulation device as set forth in claim 1, wherein said dose coefficient interpolating/extrapolating means, when an experimentally extracted moment parameter is dependent on a dose value, further interpolates and extrapolates said dose-dependent moment parameter with respect to logarithmic values of all doses.

4. The ion implantation process simulation device as set forth in claim 1, wherein said dose coefficient interpolating/extrapolating means, when moment data, and an amorphous component dose coefficient and a channeling component dose coefficient $D_{main, i}$, $D_{sub, i}$ and $D_{sub, i+1}$ of the ion implantation profile at dose values $D_{T, i}$ and $D_{T, i+1}$ of two points for conducting interpolation and extrapolation with respect to an arbitrary dose value $D_{T, a}$ are given, calculates an amorphous component dose coefficient and a channeling component dose coefficient $D_{main, a}$ and $D_{sub, a}$ at the arbitrary dose value $D_{T, a}$ according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}$$

when an experimentally extracted moment parameter is dependent on a dose value, further defines dose-dependent moment parameters at dose values $D_{T, i}$ and $D_{T, i+1}$ of two points for conducting interpolation and extrapolation with respect to an arbitrary dose value $D_{T, a}$ as $\mu_{m, i}$ and $\mu_{m, i+1}$, respectively, and calculates a moment parameter $\mu_{m, a}$ at the arbitrary dose value $D_{T, a}$ according to the following equation:

$$\mu_{m,a} = \frac{(\log D_{T,i+1} - \log D_{T,a})\mu_{m,i} + (\log D_{T,a} - \log D_{T,i})\mu_{m,i+1}}{(\log D_{T,i+1} - \log D_{T,i})}.$$

5. An ion implantation process simulation method of conducting ion implantation process simulation for a semiconductor device to conduct interpolation and extrapolation necessary for an ion implantation profile, comprising the steps of:

extracting, from ion implantation profile data, moment parameters, projected range, standard deviation, skewness and kurtosis, in two normalized functions respectively representing an amorphous component and a channeling component, an amorphous component dose coefficient and a channeling component dose coefficient to generate a data table;

obtaining a parameter for use in the interpolation and extrapolation of a dose coefficient from said data table generated at said data extracting step; and out of parameters obtained at said interpolation data obtaining step, using two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions, as well as using, at the time of describing said ion implantation profile for a dose value designated by a user, dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values.

6. The ion implantation process simulation method as set forth in claim 5, wherein at said dose coefficient interpolating/extrapolating step, when moment data, and an amorphous component dose coefficient and a channeling component dose coefficient $D_{main, i}$, $D_{sub, i}$ and $D_{sub, i+1}$ of the ion implantation profile at dose values $D_{T, i}$ and $D_{T, i+1}$ of two points for conducting interpolation and extrapolation with respect to an arbitrary dose value $D_{T, a}$ are given, an amorphous component dose coefficient and a channeling component dose coefficient $D_{main, a}$ and $D_{sub, a}$ at the arbitrary dose value $D_{T, a}$ are calculated according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}.$$

7. The ion implantation process simulation method as set forth in claim 5, wherein said dose coefficient interpolating/extrapolating step further comprises the step of, when an experimentally extracted moment parameter is dependent on a dose value, interpolating and extrapolating said dose-dependent moment parameter with respect to logarithmic values of all doses.

8. The ion implantation process simulation method as set forth in claim 5, wherein at said dose coefficient interpolating/extrapolating step, when moment data, and an amorphous component dose coefficient and a channeling component dose coefficient $D_{main, i}$, $D_{sub, i}$ and $D_{sub, i+1}$ of the ion implantation profile at dose values $D_{T, i}$ and $D_{T, i+1}$ of two points for conducting interpolation and extrapolation with respect to an arbitrary dose value $D_{T, a}$ are given, an amorphous component dose coefficient and a channeling component dose coefficient $D_{main, a}$ and $D_{sub, a}$ at the arbitrary dose value $D_{T, a}$ are calculated according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}$$

when an experimentally extracted moment parameter is dependent on a dose value, dose-dependent moment parameters at dose values $D_{T, i}$ and $D_{T, i+1}$ of two points for conducting interpolation and extrapolation with respect to an arbitrary dose value $D_{T, a}$ are defined as $\mu_{m, i}$ and $\mu_{m, i+1}$, respectively, and a moment parameter $\mu_{m, a}$ at the arbitrary dose value $D_{T, a}$ is calculated according to the following equation:

$$\mu_{m,a} = \frac{(\log D_{T,i+1} - \log D_{T,a})\mu_{m,i} + (\log D_{T,a} - \log D_{T,i})\mu_{m,i+1}}{(\log D_{T,i+1} - \log D_{T,i})}$$

9. An ion implantation process simulation method of conducting ion implantation process simulation for a semiconductor device to conduct interpolation and extrapolation necessary for an ion implantation profile, comprising the steps of:
using two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions; and
using dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values.

10. The implantation process simulation method as set forth in claim 9, wherein
at said step of interpolating and extrapolating a logarithmic value of said channeling component dose coefficient with respect to logarithmic values of all dose values, with respect to an arbitrary dose value as a target of interpolation and extrapolation, a channeling component dose coefficient for the arbitrary dose value is interpolated and extrapolated by using said amorphous component dose coefficients and channeling component dose coefficients at dose values of two points most neighboring to the dose value.

11. An ion implantation process simulation method of conducting ion implantation process simulation for a semiconductor device to conduct interpolation and extrapolation necessary for an ion implantation profile, comprising the steps of:
using two normalized functions respectively representing an amorphous component and a channeling component, and an amorphous component dose coefficient and a channeling component dose coefficient corresponding to the two functions to express a profile of ion implantation into a semiconductor crystal substrate as linear connection of said two functions; and
using moment parameters extracted from the ion implantation profile and linear connection coefficients at a plurality of dose values to, when an experimentally extracted moment parameter is dependent on a dose value, interpolate and extrapolate said dose-dependent moment parameter with respect to logarithmic values of all dose values.

12. The implantation process simulation method as set forth in claim 11, wherein
at said step of interpolating and extrapolating a logarithmic value of said channeling component dose coefficient with respect to logarithmic values of all dose values, with respect to an arbitrary dose value as a target of interpolation and extrapolation, dose-dependent said moment parameters at dose values of two points most neighboring to the dose value are used to interpolate and extrapolate a moment parameter for the dose value.

13. A computer readable memory having a control program for controlling an ion implantation process simulation device to conduct ion implantation process simulation for a semiconductor device and conduct interpolation and extrapolation necessary for an ion implantation profile, said control program comprising the steps of:
from ion implantation profile data, extracting moment parameters, projected range, standard deviation, skewness and kurtosis, in two normalized functions respectively representing an amorphous component and a channeling component, an amorphous component dose coefficient and a channeling component dose coefficient to generate a data table;
obtaining a parameter for use in the interpolation and extrapolation of a dose coefficient from said data table generated at said data extracting step; and
out of parameters obtained at said interpolation data obtaining step, using two normalized functions respectively representing an amorphous component and a channeling component, and an amorphous component dose coefficient and a channeling component dose coefficient corresponding to the two functions to express a profile of ion implantation into a semiconductor crystal substrate as linear connection of the two functions, as well as using, at the time of describing said ion implantation profile for a dose value designated by a user, dose-independent moment parameters extracted from the ion implantation profile and coefficients of said linear connection dependent on dose at a plurality of dose values to interpolate and extrapolate a logarithmic value of said channeling component dose coefficient with respect to logarithmic values of all dose values.

14. The computer readable memory as set forth in claim 13, wherein at said dose coefficient interpolating/extrapolating step of said control program, when moment data, and an amorphous component dose coefficient and a channeling component dose coefficient $D_{main,\ i}$, $D_{sub,\ i}$ and $D_{sub,\ i+1}$ of the ion implantation profile at dose values $D_{T,\ i}$ and $D_{T,\ i+1}$ of two points for conducting interpolation and extrapolation with respect to an arbitrary dose value $D_{T,\ a}$ are given, an amorphous component dose coefficient and a channeling component dose coefficient $D_{main,\ a}$ and $D_{sub,\ a}$ at the arbitrary dose value $D_{T,\ a}$ are calculated according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}.$$

15. The computer readable memory as set forth in claim 13, wherein
said dose coefficient interpolating/extrapolating step of said control program further comprises the step of, when an experimentally extracted moment parameter is dependent on a dose value, interpolating and extrapolating said dose-dependent moment parameter with respect to logarithmic values of all doses.

16. The computer readable memory as set forth in claim 13, wherein
at said dose coefficient interpolating/extrapolating step of said control program,
when moment data, and an amorphous component dose coefficient and a channeling component dose coefficient $D_{main,\ i}$, $D_{sub,\ i}$ and $D_{sub,\ i+1}$ of the ion implantation profile at dose values $D_{T,i}$ and $D_{T,i+1}$ of two points for conducting interpolation and extrapolation with respect to an arbitrary dose value $D_{T,a}$ are given, an amorphous component dose coefficient and a channeling component dose coefficient $D_{main,a}$ and $D_{sub,a}$ at the arbitrary dose value $D_{T,a}$ are calculated according to the following equation:

$$D_{sub,a} = \frac{(\log D_{T,i+1} - \log D_{T,a})D_{sub,i} + (\log D_{T,a} - \log D_{T,i})D_{sub,i+1}}{(\log D_{T,i+1} - \log D_{T,i})}$$

$$D_{main,a} = D_{T,a} - D_{sub,a}$$

when an experimentally extracted moment parameter is dependent on a dose value, dose-dependent moment parameters at dose values $D_{T,i}$ and $D_{T,i+1}$ of two points for conducting interpolation and extrapolation with respect to an arbitrary dose value $D_{T,a}$ are defined as $\mu_{m,i}$ and $\mu_{m,i+1}$, respectively, to calculate a moment parameter $\mu_{m,a}$ at the arbitrary dose value $D_{T,a}$ according to the following equation:

$$\mu_{m,a} = \frac{(\log D_{T,i+1} - \log D_{T,a})\mu_{m,i} + (\log D_{T,a} - \log D_{T,i})\mu_{m,i+1}}{(\log D_{T,i+1} - \log D_{T,i})}.$$

* * * * *